US006727655B2

(12) United States Patent
McChesney et al.

(10) Patent No.: US 6,727,655 B2
(45) Date of Patent: Apr. 27, 2004

(54) METHOD AND APPARATUS TO MONITOR ELECTRICAL STATES AT A WORKPIECE IN A SEMICONDUCTOR PROCESSING CHAMBER

(76) Inventors: Jon McChesney, 35 Brewin La., San Ramon, CA (US) 94583; Alex Paterson, 1035 Coleman Rd., #4207, San Jose, CA (US) 95123; Valentin N. Todorow, 3300 Wolcott Common #202, Fremont, CA (US) 94538; John Holland, 1565 Calaveras Ave., San Jose, CA (US) 95126; Michael Barnes, 12215 Santa Teresa Dr., San Ramon, CA (US) 94583

( * ) Notice: Subject to any disclaimer, the term of this patent is extended or adjusted under 35 U.S.C. 154(b) by 0 days.

(21) Appl. No.: 10/055,437

(22) Filed: Oct. 26, 2001

(65) Prior Publication Data

US 2003/0082835 A1 May 1, 2003

(51) Int. Cl.[7] .................................................. H01J 7/24
(52) U.S. Cl. ............................. 315/111.21; 156/345.24
(58) Field of Search ...................... 315/111.21, 111.41, 315/111.51, 111.71; 156/345.13, 345.16, 345.24, 345.25, 345.15

(56) References Cited

U.S. PATENT DOCUMENTS

| | | | | |
|---|---|---|---|---|
| 4,496,448 A | | 1/1985 | Tai et al. ................ 204/192.32 |
| 5,273,610 A | * | 12/1993 | Thomas et al. ......... 156/345.28 |
| 5,576,629 A | * | 11/1996 | Turner et al. ............ 315/111.21 |
| 5,708,250 A | | 1/1998 | Benjamin et al. ....... 219/121.58 |
| 5,989,349 A | | 11/1999 | Ke et al. ...................... 118/728 |
| 6,125,025 A | * | 9/2000 | Howald et al. .............. 361/234 |
| 6,174,450 B1 | * | 1/2001 | Patrick et al. .......... 156/345.28 |
| 6,198,616 B1 | | 3/2001 | Dahimene et al. ........... 361/234 |
| 6,221,782 B1 | | 4/2001 | Shan et al. .................. 438/710 |

OTHER PUBLICATIONS

Patrick et al. Application of Direct Bias Control in High–Density Inductively Coupled Plasma Etching Equipment, J. Vac.Sci. Technol.A 18(2), Dec. 3, 1999. Pp. 405–410.
Sobolewski, Mark A. Measuring the Ion Current High–Density Plasmas Using Radio Current and Voltage Measurements, Journal of Applied Physics, Jun. 10, 2001. Pp. 2660–2671.

* cited by examiner

Primary Examiner—James Clinger
Assistant Examiner—Ephrem Alemu
(74) Attorney, Agent, or Firm—Law Office of Kenneth C. Brooks; Joseph Bach

(57) ABSTRACT

A method and apparatus is disclosed to monitor and/or control the electrical states at a workpiece disposed in a plasma chamber that is in electrical communication with an RF signal source over a defined signal path. The method includes ascertaining an impedance of the signal path, sensing electrical characteristics of the RF power at the RF signal source and obtaining values of the electrical states at the workpiece. To provide a more accurate model of the electrical states at the workpiece, the modeling includes information concerning the impedance introduced by the signal path. This technique may be employed to provide feedback control of the RF generator, so that the electrical states may be dynamically adjusted be within predefined, or desired, parameters.

22 Claims, 4 Drawing Sheets

METHOD AND APPARATUS TO MONITOR ELECTRICAL STATES AT A WORKPIECE IN A SEMICONDUCTOR PROCESSING CHAMBER

BACKGROUND OF THE INVENTION

This invention relates generally to plasma chambers used for fabricating semiconductor devices. More specifically, this invention relates to apparatus and methods for monitoring and controlling the electrical states at a workpiece mounted to one or more chamber electrodes.

BACKGROUND OF THE INVENTION

Fabrication of semiconductor devices often utilizes plasma processing equipment for etch and deposition steps that are needed in order to create transistors on the surface of silicon wafers or other workpieces. Usually, these plasma processing reactors have conductive walls and employ a support pedestal upon which the workpiece is placed during the process. Typically, the pedestal includes a conductive body that is connected to a radio frequency RF power supply. During most processing steps, the power supply is activated, with the conductive body functioning as a cathode electrode and the walls functioning as an anode electrode. In this manner, the electrical states at the workpiece are varied during processing.

For example, the body of the plasma is positively charged with respect to the average DC potential on the cathode and anode electrodes. The DC voltage at the cathode is referred to as the "cathode DC bias" and changes the electrical states at the workpiece so that ions from the plasma accelerate toward and bombard the workpiece to promote chemical or physical reactions desired for the semiconductor fabrication process. The cathode DC bias also has an influence on the ability to electrostatically clamp the workpiece to the pedestal. Typically, a DC voltage is applied to the pedestal to vary the electrical states at the workpiece in order to create an electrostatic force between the workpiece and the surface of the pedestal. Presence of DC bias voltage due to the applied RF signal will superimpose on the DC voltage supplied for the electrostatic force. The superimposition of the two voltages alters the electrical states at the workpiece by varying the electrostatic force by either reducing or increasing the same, depending on the polarity of the DC supply. Since it is desirable to maintain a constant electrostatic force during processing, accurate knowledge of the electrical states, such as DC bias voltage, at the workpiece is desired. As a result, there are many prior art attempts to determine and/or control the electrical states at a workpiece.

Traditionally, the electrical states at the workpiece were determined by preventing transmission losses in the signal path between a voltage source and the cathode electrode. According to one traditional manner, RF power supplied to a cathode was determined by controlling the resistivity of the load connected to the RF generator. To that end, RF generator is coupled to the process chamber through a matching network. The matching network transforms the complex load of plasma and chamber so they appear to the generator as a purely 50 Ω resistive load. The 50 Ω resistive load is believed to maximize the power delivered to the cathode; hence, the power measured at the generator output was believed to match the power level delivered at the cathode. However, the actual power delivered to the electrode often differed from the power generated by the generator.

Another technique for determining the electrical states at a workpiece involved determining the set point of the electrode DC bias. This is achieved by employing an RF peak detecting circuit coupled to the electrode. The peak detecting circuit is included with a circuit for controlling the DC voltage applied to the chuck. The control circuit supplies an unamplified replica of a DC voltage derived by the peak detecting circuit to the chuck DC power supply source via a DC circuit including only passive elements so the level of the DC voltage applied to the chuck varies in response to variations in the peak amplitude of the RF voltage.

Another method of controlling cathode DC bias in a plasma chamber employs a dielectric shield. The dielectric shield is positioned between the plasma and a selected portion of the electrically grounded components of the chamber, such as the electrically grounded chamber wall. The cathode DC bias is adjusted by controlling one or more of the following parameters: (1) the surface area of the chamber wall or other grounded components which is blocked by the dielectric shield; (2) the thickness of the dielectric; (3) the gap between the shield and the chamber wall; and (4) the dielectric constant of the dielectric material.

As stated by Patrick et al. in *Application of Direct Bias Control in High-Density Inductively Coupled Plasma Etching Equipment*, J. Vac. Sci. Technol. A 18(2), March/April 2000 it is difficult to provide reproducible DC bias voltages on successively processed wafers, because, any variation in match resistance leads directly to differences in power delivered to the load for the given RF power supply setpoint. This may be attributed to, inter alia, to variations in RF power supply and match network resistance, as well as the presence of stray capacitance. Patrick et al. advocate use of a peak voltage sensor mounted immediately below the chuck in a feedback loop to the RF generator to accurately determine the electrode DC bias. Controlling the power delivery in this manner facilitates compensating for the effects of power losses in the RF circuit between the generator and the chuck.

A drawback with these prior art techniques that employed sensors was that the same often provide inaccurate measurements of the power level at the electrode. The accuracy of the sensor measurements are degraded at high electrode voltages due to the presence of large signal noise. In addition, accurately calibrating a sensor placed near the workpiece electrode can also be problematic due to the limited access area available.

As a result, there is a need to provide an improved technique for determining the electrical states at a workpiece during processing.

SUMMARY OF THE INVENTION

A method and apparatus is disclosed that determines the electrical state at a workpiece disposed on an electrode in a plasma chamber that is in electrical communication with an RF signal source over a signal path. The signal path includes the electrode and the conductive path between the RF signal source and the workpiece. The method includes ascertaining an impedance of the signal path, sensing electrical characteristics associated with RF energy produced by the RF signal source and obtaining information on the electrical states at the workpiece. The electrical states include information concerning the RF voltage, RF current, the phase between the RF voltage and RF current, the DC bias voltage induced on the substrate, as well as a flux of ions striking the substrate. The electrical states are determined as a function of signal path impedance and the electrical properties of the RF signal. As a result, knowledge of the impedance of the signal path facilitates creating a real-time model of the electrical states at the workpiece by dynamically measuring the complete electrical characteristics, such as voltage, current, and phase difference, between the voltage and current of the RF signal, at some point along the signal path. To that end, the impedance may be determined by directly measuring the signal path employing an impedance meter or by calculating the same using well known physics and mathematical concepts. To provide a more accurate model of the electrical states at the workpiece, the modeling may include information concerning the impedance encountered by the RF signal that is introduced by the signal path. Accurate knowledge of the electrical states at the workpiece allows, inter alia, the completion of specific processing steps to be determined from temporal changes in the electrical state. This facilitates accurate control of the duration of plasma processing steps and affords process endpoint detection.

In accordance with an alternate embodiment of the method, the voltage, current and phase of the RF signal may be controlled by dynamically adjusting the RF generator in accordance with the modeling data or process endpoint from these measurements. In this manner, the characteristics of the RF signal may be maintained within predefined, or desired, parameters. A constant electrostatic force may be maintained between a pedestal and a workpiece electrostatically clamped to the pedestal, by adjusting the DC voltage supply in response to the determined electrical state.

The apparatus, in accordance with one embodiment, includes a processing chamber and a plasma generation system. The plasma generation system includes the electrode and the RF signal source. A sensor is in electrical communication with the electrode and the RF signal source. A controller is in electrical communication with the plasma generation system and a memory. The memory comprises a computer-readable medium having a computer-readable program embodied therein that carries out the functions of the methods.

DETAILED DESCRIPTION OF EXEMPLARY EMBODIMENTS OF THE INVENTION

Figure 1:
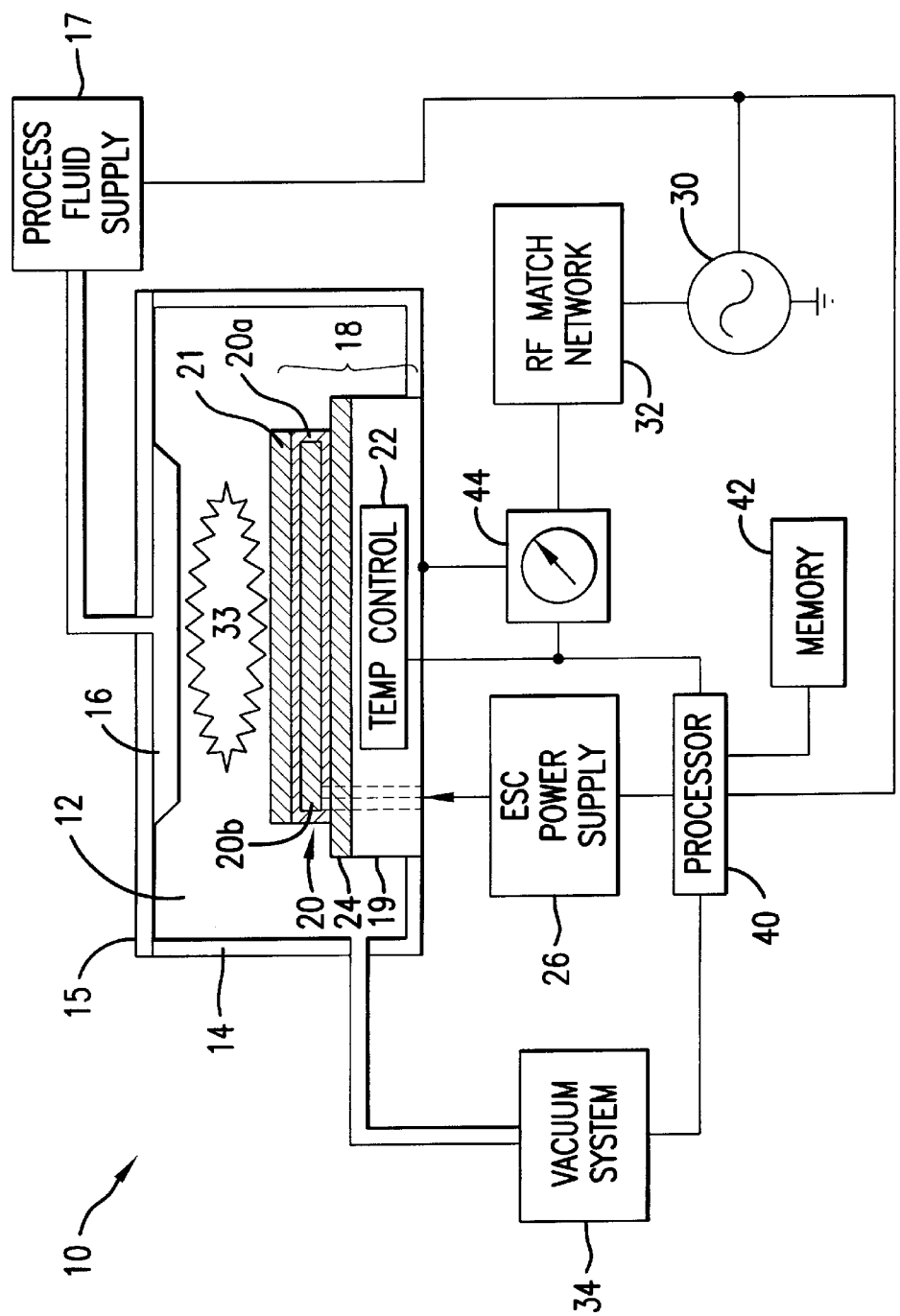
FIG. 1 is a cross-sectional view of a semiconductor processing system, in accordance with one embodiment of the present invention.

An exemplary processing apparatus in accordance with the present invention is shown as a plasma reactor 10, known as a plasma source chamber. Reactor 10 includes an environmentally controlled processing chamber 12 defined by a grounded, conductive, cylindrical sidewall 14 and a ceiling 15. Ceiling 15 may have any shape desired, e.g., arcuate or rectangular. As shown, ceiling 15 has a rectangular shape, and includes a showerhead 16 mounted thereto to allow process fluids from process fluid supply 17 to reach processing chamber. Reactor 10 includes a pedestal 18 assembly having a base 19 and an electrostatic chuck 20 mounted to base 19. Electro-static chuck 20 supports a workpiece 21, and temperature control hardware 22 is included in base 19 to control the temperature of pedestal assembly 18 and, therefore, workpiece 21. Chuck 20 includes a dielectric body 20a containing at least one embedded electrode 20b. Dielectric body 20a is attached to base 19 via a mounting plate 24.

Chuck 20 is in electrical communication with an ESC power supply 26 to provide a DC voltage to chuck 20, which results in an electrostatic field on chuck 20. The electrostatic field pulls workpiece 21 firmly against chuck 20. This maintains the position of workpiece 21 on pedestal 18 during processing. An RF power supply or generator 30 is in electrical communication to base 19 through RF match network 32. Base 19 is formed from conductive material and functions as a cathode electrode, ceiling 15 is grounded and functions as an anode. The electrical field generated between ceiling 15 and electrode 19 excites a process fluid to form a plasma 33 therebetween. A vacuum system 34 controls the chamber pressure.

A processor 40 controls the operations of reactor 10. Processor 40 is in data communication with a memory 42, as well as the various subsystems of reactor 10, process fluid supply 17, vacuum system 34, and RF generators 30. Memory 42 may include either volatile or non-volatile memory storage devices. Examples of non-volatile memory devices include a floppy disk drive having a floppy disk, a hard disk drive, an array of hard disk drives and the like. An example of a volatile memory device includes a random access memory. Memory 42 stores a computer program that includes sets of instructions that dictate various process parameters, including the chamber pressure and RF power levels and the like.

An exemplary semiconductor process that may be employed etches the workpiece 21 in order to form, inter alia, interconnect lines thereon. To that end, an etchant gas, such as $Cl_2$, $BCl_3$, $CF_4$, HBr, $NF_3$, $SF_6$ and the like can be employed either alone, or in combination with, a non-halogen containing gas such as nitrogen, $N_2$, oxygen, $O_2$, helium, He, argon, Ar or some combination thereof. The etchant gas is passed from gas source 17 into processing chamber 12 via showerhead 16. Specifically, process gas traverses showerhead 16 to enter processing chamber 12 expose workpiece 21, disposed on pedestal 18, to the etchant fluids. RF generator 30 is activated to create high-density plasma from the process fluids creating radicals that facilitate etching of semiconductor substrate 21.

To provide accurate control of the plasma processing conditions, a sensor 44 is connected between match network 32 and electrode 19. Sensor 44 detects characteristics of the RF signal produced by RF generator 30 and propagating along a path from generator 30 to electrode 19. These characteristics include power, voltage, current and phase between the voltage and current. Sensor 44 facilitates determination of one or more electrical states at workpiece 21 in cooperation with an algorithm that relates characteristics of the RF signal produced by RF generator 30 to the electrical states. The algorithm also relates the electrical states of process conditions. As a result, the algorithm affords control of the electrical states at workpiece 21 and process conditions. Examples of the electrical states that may be ascertainted and/or controlled include RF voltage on electrode 19, RF current on electrode 19, the phase difference between the RF voltage and the RF current, as well as the induced DC bias voltage on workpiece 21 and an electrostatic clamping force between chuck 20 and workpiece 21 and the current or flux of ions produced by plasma and striking workpiece 21.

One example of controlling the electrical states is discussed with respect to controlling DC bias voltage, $V_{dc}$. This is achieved by adjusting the output of RF generator, 30, in response to the value of $V_{dc}$, derived from both the electrical characteristic measured at the sensor 44 and the knowledge of the impedance of the signal path. The algorithm relates changes in the characteristics of the RF signal produced by RF generator 30 to the DC bias voltage $V_{dc}$. Specifically, $V_{dc}$ may be defined as follows:

$$V_{dc} = -V_{pp}/2 + V_p \qquad 1.$$

wherein $V_p$ is the plasma potential measured using standard techniques, such as use of a Langmuir probe. $V_{pp}$ is the peak-to-peak RF voltage on electrode 19. The term $V_{pp}/2$ is determined by the aforementioned algorithm and is defined as follows:

$$V_{pp}/2\sqrt{2} = |V_{match} + I_{match} \cdot (\cos \Phi + i \sin \Phi) \cdot Z_{signalpath}|. \qquad 2.$$

The terms $V_{match}$, $I_{match}$, $\cos \Phi$, and $i \sin \Phi$ correspond to the characteristics of the RF signal measured by sensor 44. The term $Z_{signalpath}$ corresponds to the impedance in the signal path from RF generator 30 to electrode 19. The term $Z_{signalpath}$ may be determined by directly measuring the impedance in this path using, for example, a vector impedance meter or a RF network analyzer. Alternatively, the value for $Z_{signalpath}$ may be determined using standard mathematical computations and an estimation of the circuit components, which make up the signal path.

In one example, the term $Z_{signalpath}$ is determined mathematically by calculating the contribution of electrode 19 as well as other components that may contribute to the impedance in the signal path between electrode 19 and RF generator 30. The contribution may be defined by the following:

$$Z_{signalpath} = \left[ \left( \frac{1}{j2\pi(fr_1)C_{eff}} + j2\pi(fr_1)L_{eff} + r_{loss} \right)^{-1} + \left( \frac{1}{j2\pi(fr_1)2C_{eff2}} \right)^{-1} \right]^{-1}. \qquad 3.$$

Figure 2:
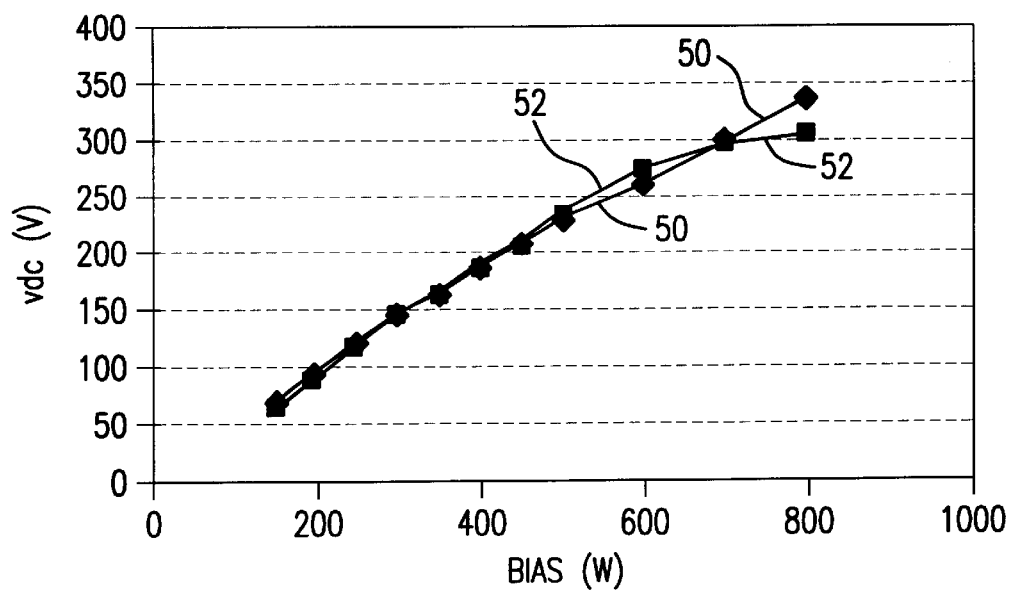
FIG. 2 is a graph of $V_{dc}$ bias voltage versus bias power in watts to compare directly-measured $V_{dc}$ with $V_{dc}$ calculated in accordance with one embodiment of the present invention.

The term $(fr_1)$ corresponds to the frequency of the RF signal produced by generator 30, and the terms $L_{eff}$ and $C_{eff}$ correspond to the effective series inductance and series capacitance of the signal path, respectively. The term $r_{loss}$ corresponds to the effective series resistance of the signal path and $C_{eff2}$ the parallel capacitance of the signal path. Determining a value for $Z_{signalpath}$ employing equation 3, measurements of $V_{dc}$ on workpiece 21 in accordance with equations 1 and 2 were obtained, defining calculated DC bias measurements. These measurements were compared with directly measured values of $V_{dc}$, defining directly-measured DC bias measurements. The correspondence between calculated DC bias measurements and directly-measured DC bias measurements are shown in FIG. 2. Curve 50 corresponds to the calculated DC bias measurements, and curve 52 corresponds to the directly-measured DC bias measurements. As shown, curves 50 and 52 are in superimposition for nearly all power levels.

Referring again to FIG. 1 is another example of an electrical state that may be controlled is discussed with respect control of an electrostatic force between chuck 20 and workpiece 21. To that end, the output of ESC power supply 26 may be regulated in response to the value of the DC bias measurements. In order to maintain a constant electrostatic force, the output of ESC power supply 26 is either decreased or increased in response to the calculated DC bias measurements, depending on the polarity of the voltage. Were the negative polarity output of ESC power supply 26 connected to chuck 20, then the output of ESC power supply 26 is increased in response to any increases of $V_{dc}$. Similarly, if positive polarity output of ESC power supply 26 is connected to chuck 20, then the output of the DC supply is decreased in response to any increases of $V_{dc}$. Typically, adjustments of ESC power supply 26 are made in order to maintain the magnitude of the difference between the ESC voltage and the DC bias voltage to be constant throughout the plasma process.

Yet another example of an electrical state at workpiece 21 that may be ascertained and/or controlled is discussed with respect to the flux of ions, or current, generated by plasma 33 that strike workpiece 21. This may be determined by dividing the RF power at workpiece by the RF voltage at workpiece 21.

An additional benefit provided by the present invention concerns controlling the duration of the plasma processing recipe. The temporal changes in the electrical states at workpiece 21, which are determined from the electrical characteristic measured at the sensor, 44, and the knowledge of the impedance of the RF signal path can indicate the completion of certain steps of the plasma process. Specifically, endpoint of a plasma etch is recognizable from the sudden change in the determined RF peak voltage at workpiece 21. The determination of an endpoint can be used based solely on this temporal change in the RF peak voltage, or could be determined from a combination of the temporal changes in the electrical states at the workpiece and changes in other chamber sensors, for example, changes in the optical emission intensity from the plasma.

The position of sensor 44 on the RF signal path can be optimized in order to increase the accuracy of the electrical characteristics that are measured by sensor 44. Often, the voltage and current waveforms present on electrode 19 for the RF signal are nearly 90° out of phase, typically between 88° and 90°. As a result, it is very difficult to obtain accurate measurements of power and impedance without knowledge of the cosine of the phase difference between the RF voltage and the RF current. Small errors in the cosine of angles near 90° induce large errors in the derived values. This problem may be overcome by placement of sensor 44 at a location along the RF signal path at which the phase difference between the voltage and the current can be less than 80°, even though the phase difference at electrode 19 between voltage and current is between 88° and 90°. The phase difference at electrode 19 can be determined from the output of sensor 44 by use of the characterized, i.e., calculated or measured, impedance of the signal path. Similarly, the power delivered to electrode 19 can be calculated at the output of sensor 44 in accordance with the following equation:

$$P_{delivered} = V \cdot I \cdot (\cos \Phi_i). \qquad 4.$$

where V and I are the RF voltage and RF current associated with the RF signal produced by RF generator 30 and measured by sensor 44.

Figure 5:
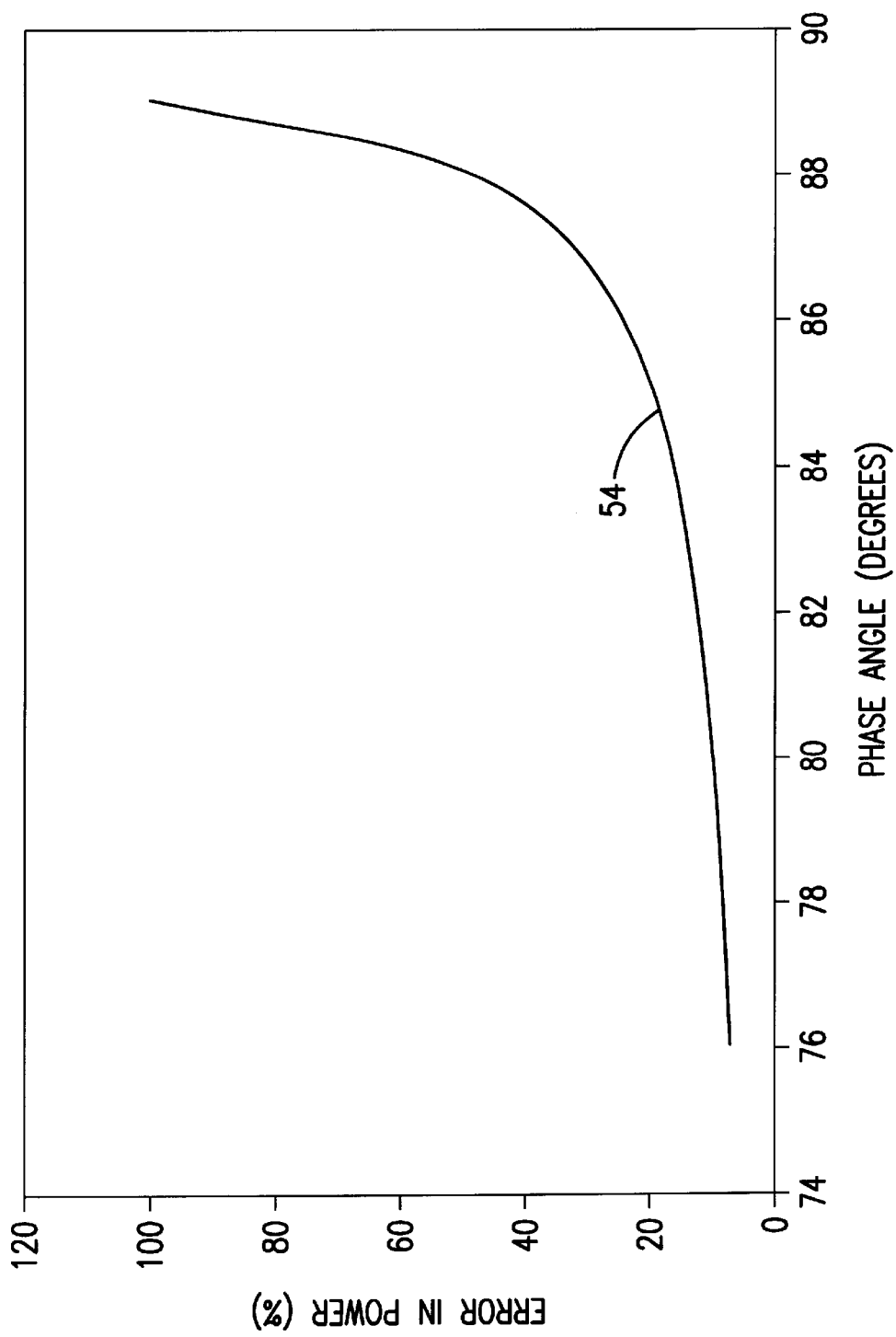
FIG. 5 is a graph demonstrating error in power measurements versus phase difference between plasma voltage and plasma current.

Referring to FIGS. 1 and 5, curve 54 shows estimated errors for the power and phase measurements assuming a 1° uncertainty in the RF phase measurement. Positioning sensor 44 in the signal path produces less uncertainty in the determination of the electrical states at the workpiece as long as accurate knowledge of the impedance of the signal path is available. The location of sensor 44 in the RF signal path is chosen to minimize the detrimental effects of noise by locating sensor 44 at a position where the magnitude of RF voltage is less than it is at the electrode and by use of shielding of sensor 44. Shielding of sensor 44 near electrode 19 is very difficult due to problems with providing a low impedance ground return path for the shielding. However, shielding of sensor 44 can be easily accomplished if sensor 44 is placed at a position nearer to RF match network 32 that supplies the RF signal to electrode 19. In the preferred embodiment, the RF shielding which is used to provide a ground return path for RF match network 33 is the same shielding which is used to isolate electronics of RF sensor 44 from possible sources of noise.

Referring to FIG. 1, as discussed above, computer program having sets of instructions controls the various subsystems of plasma reactor 10. The computer program code may be written in any conventional computer readable programming language: for example, 68000 assembly language, C, C++, Pascal, Fortran and the like. Suitable program code is entered into a single file or multiple files using a conventional text editor and stored or embodied in a computer-readable medium, such as a memory system of the computer. If the entered code text is a high level language, the code is compiled. The resultant compiler code is then linked with an object code of precompiled Windows® library routines. To execute the linked and compiled object code the system user invokes the object code, causing the computer system to load the code in memory 42. Processor 40 then reads and executes the code to perform the tasks identified in the program, including the methods to determine one or more electrical states at workpiece 21.

Figure 3:
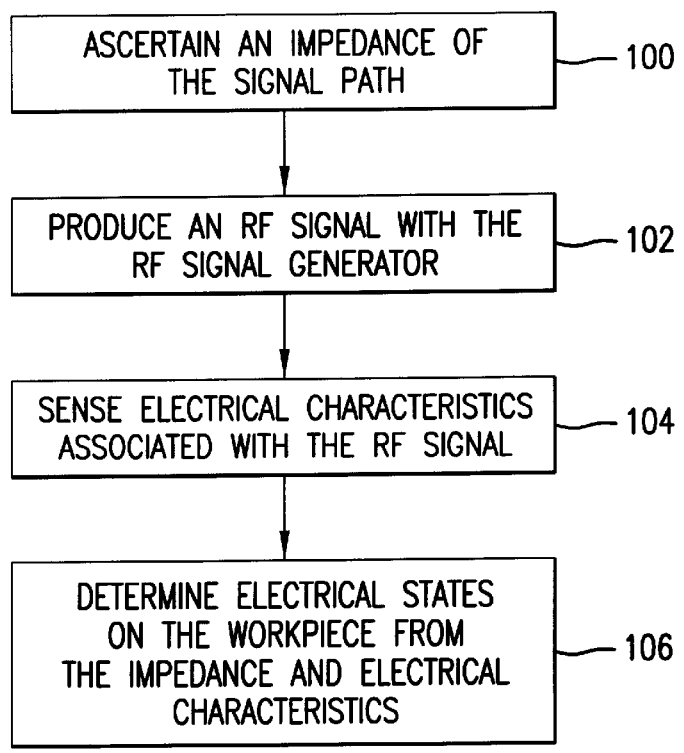
FIG. 3 is a flow diagram showing the measurement of RF electrical characteristics in accordance with one embodiment of the present invention.

Referring to both FIGS. 1 and 3 one method to determine electrical states at workpiece 21 according to one embodiment of the present invention involves ascertaining an impedance of the signal path, at step 100. At step 102, signal generator 30 produces an RF signal. The RF signal propagates through match network 32 and is transmitted to electrode 19. At step 104, sensor 44 senses electrical characteristics of the RF signal and produces information concerning the same. The characteristics that are sensed include RF voltage, RF current, and the phase difference between the RF voltage and the RF current. The information concerning the RF signal characteristics is transmitted to processor 40. Processor 40, operating on an algorithm stored in memory 42 determines one or more of the electrical states at workpiece 21, such as, a magnitude of a DC bias thereon, as step 106. This is determined as a function of the impedance and the characteristics employing the equations 1, 2 and 3.

Figure 4:
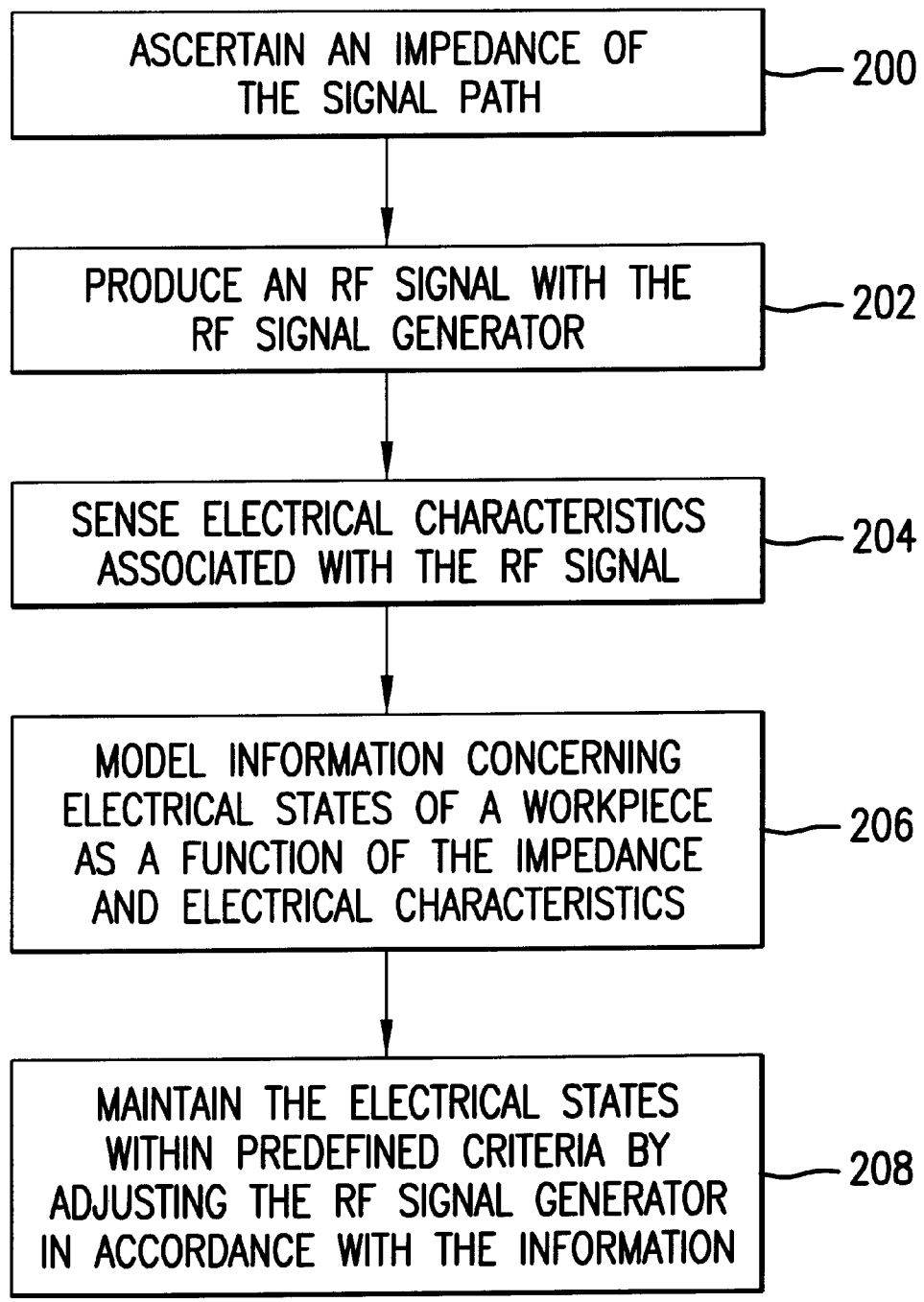
FIG. 4 is a flow diagram showing the control of RF electrical characteristics in accordance with another embodiment of the present invention.

Referring to FIGS. 1 and 4, in an alternate embodiment, a method of controlling one or more of the electrical states at workpiece 21 is provided. At step 200, the signal path is ascertained. At step 202, signal generator 30 produces an RF signal. The RF signal propagates through match network 32 and is transmitted to electrode 19. At step 204, sensor 44 senses electrical characteristics of the RF signal and produces information concerning the same. The characteristics that are sensed include the RF voltage, the RF current, and the phase difference between the RF voltage and the RF current. The information concerning the RF signal characteristics is transmitted to processor 40. Processor 40, operating on an algorithm stored in memory 42 models one or more of the electrical states at workpiece 21 as a function of the impedance of signal path and the RF signal characteristics, at step 206 employing the equations 1, 2, and 3. At step 208, processor 40 compares the model information with a predefined criteria stored within memory 42 and adjusts signal generator 30 in accordance with the modeling information to maintain the electrical states at workpiece 21 within the predefined criteria.

Although the foregoing has been described with respect to etching a workpiece with a capacitively coupled plasma source, it should be understood that the present invention may be employed in virtually any semiconductor processing system, such as an inductively coupled plasma etching system. In addition, the present invention may be employed with other semiconductor processes, such as, CVD deposition or a sputter deposition and provide benefits in addition to those mentioned above. For example, fault detection could be achieved by a priori knowledge of the operational characteristics of the reactor and identifying operational characteristics of the reactor that are out of tolerance during processing. Another benefit is that the present invention allows scaling the operational parameters appropriately to fine-tune processing conditions for workpieces of differing sizes. In this manner, process conditions for workpieces having 200 mm diameters could be optimized for workpiece having larger diameters, e.g., 300 mm diameter, or workpieces with smaller diameters. Thus, the embodiments that comprise the present invention should not be construed based solely upon the description recited above. Rather, the embodiments that comprise the present invention should be construed in view of the following claims, including the full scope of equivalents thereof.

What is claimed is:

1. A method of determining electrical states at a workpiece, disposed in a semiconductor processing plasma chamber, which is in electrical communication with an RF signal source over a signal path, said method comprising:
   ascertaining an impedance of said signal path;
   producing, with said RF signal source, an RF signal having voltage and current associated therewith, said voltage and current having a corresponding phase angle associated therewith;
   sensing electrical characteristics associated with said RF signal; and
   determining said electrical states as a function of said impedance and said electrical characteristics during processing of said workpiece;
   wherein said electrical states are selected from a group consisting of RF voltage at said workpiece, RF current at said workpiece, phase between said RF voltage and said RF current at said workpiece, power at said workpiece, induced DC bias voltage at said workpiece, a flux of ions striking workpiece, and an electrostatic force.

2. The method as recited in claim 1 further including providing an electrostatic chuck to support said workpiece and an electrostatic power supply in electrical communication with said chuck to produce an electrostatic force and maintaining said electrostatic force to be within a desired criteria by selectively adjusting said electrostatic power supply in response to information corresponding to said induced DC bias voltage.

3. The method as recited in claim 1 wherein determining said electrical states further includes producing derived values by sensing said electrical characteristics at a section along said signal path where said phase angle is less than 80°.

4. The method as recited in claim 1 further including identifying a change in said electrical states over time to ascertain an endpoint of a process.

5. The method as recited in claim 1 wherein ascertaining an impedance further includes ascertaining an impedance of said signal path with said signal path including an electrode located proximate to said workpiece.

6. The method as recited in claim 1 wherein ascertaining said impedance further includes measuring said impedance with an impedance meter.

7. The method as recited in claim 1 wherein ascertaining said impedance further includes calculating said impedance.

8. The method as recited in claim 1 wherein ascertaining said impedance further includes dynamically calculating said impedance.

9. The method as recited in claim 1 further including maintaining said electrical states to be within desired criteria by selectively adjusting said RF signal source in response to information corresponding to said electrical states.

10. A method of determining electrical states at a workpiece, disposed in a semiconductor processing plasma chamber, which is in electrical communication with an RF signal source over a signal path, said method comprising:

ascertaining an impedance of said signal path;

producing, within said plasma chamber, a plasma by generating an RF signal with said RF signal source;

sensing electrical characteristics associated with said RF signal;

modeling information concerning said electrical states as a function of said impedance and said characteristics during processing of said workpiece, with said electrical states including RF voltage at said workpiece, RF current at said workpiece, phase between said RF voltage and said RF current at said workpiece, power at said workpiece, induced DC bias voltage at said workpiece, and a flux of ions striking said workpiece; and maintaining said electrical states within a desired criteria by adjusting said RF signal source in accordance with said information.

11. The method as recited in claim 10 further including providing an electrostatic chuck to support said workpiece and an electrostatic power supply in electrical communication with said chuck to produce an electrostatic force and maintaining said electrostatic force to be within a desired criteria by selectively adjusting said electrostatic power supply in response to information corresponding to said induced DC bias voltage.

12. The method as recited in claim 11 wherein ascertaining said impedance further includes measuring said impedance with an impedance meter.

13. The method as recited in claim 11 wherein ascertaining said impedance further includes calculating said impedance.

14. The method as recited in claim 11 wherein said electrical characteristics include a voltage, a current and phase difference, between said voltage and said current, with sensing electrical characteristics further including sensing said electrical characteristics at a point along said signal path where said phase difference is less than 80°.

15. The method as recited in claim 11 further including identifying a change in said electrical states over time to ascertain an endpoint of a process.

16. The method as recited in claim 11 wherein ascertaining an impedance further includes ascertaining an impedance of an electrode, positioned proximate to said workpiece, and said signal path.

17. The method as recited in claim 11 wherein ascertaining said impedance further includes dynamically calculating said impedance.

18. A semiconductor processing plasma apparatus having a workpiece, disposed therein, said apparatus comprising:

a processing chamber;

a plasma generation system including an electrode disposed within said processing chamber and an RF signal source in electrical communication with said electrode over a signal path, with said electrode being in electrical communication with said workpiece;

a sensor in electrical communication with said signal path;

a controller in electrical communication with said plasma generation system; and a memory in data communication with said controller, said memory comprising a computer-readable medium having a computer-readable program embodied therein, said computer-readable program including a first set of instructions including information concerning an impedance of said signal path and a second set of instructions for controlling said plasma generation system to cause said RF signal source to produce an RF signal and a third set of instructions to cause said sensor to sense electrical characteristics associated with said RF signal; and fourth set of instructions to determine, as a function of said impedance and said characteristics, electrical states at said workpiece, with said electrical states including RF voltage at said workpiece, RF current at said workpiece, phase between said RF voltage and said RF current at said workpiece, power at said workpiece, induced DC bias voltage at said workpiece, a flux of ions striking workpiece, and an electrostatic force.

19. The apparatus as recited in claim 18 further including an electrostatic chuck to support said workpiece and an electrostatic power supply in electrical communication with said chuck to produce an electrostatic force and an additional set of instructions to maintain said electrostatic force to be within desired criteria by selectively adjusting said electrostatic power supply in response to information corresponding to said induced DC bias voltage.

20. The apparatus as recited in claim 18 wherein said electrical characteristics include a voltage and a current and phase difference between said voltage and said current, with said sensor being connected to said electrical path to sense said characteristics at a point along said signal path where said phase difference is less than 80°.

21. The apparatus as recited in claim 20 wherein said first set of instructions further includes a subroutine to dynamically calculate said impedance.

22. The apparatus as recited in claim 24 further including an additional set of instructions to selectively adjust said RF signal source to vary said characteristics to maintain said electrical states within a desired criteria.

* * * * *